United States Patent [19]

Takanashi et al.

[11] Patent Number: 5,319,461
[45] Date of Patent: Jun. 7, 1994

[54] RECORDING MEDIUM AND RECORDING APPARATUS WHEREIN VOLTAGE IS APPLIED ONLY TO PERIPHERAL EDGES OF THE RECORDING MEDIUM

[75] Inventors: Itsuo Takanashi, Kamakura; Shintaro Nakagaki, Miura; Tsutou Asakura; Masato Furuya, both of Yokohama; Yoshihisa Koyama, Yokosuka; Yuji Uchiyama, Chigasaki, all of Japan

[73] Assignee: Victor Company of Japan, Ltd., Yokohama, Japan

[21] Appl. No.: 846,798

[22] Filed: Mar. 4, 1992

[30] Foreign Application Priority Data

Mar. 6, 1991 [JP] Japan .................. 3-065655

[51] Int. Cl.$^5$ .................. H04N 5/30; G11C 13/04
[52] U.S. Cl. .................. 348/294; 365/112
[58] Field of Search .................. 358/209, 213.11, 300; 365/112, 110, 106; 250/213 R

[56] References Cited

U.S. PATENT DOCUMENTS

| | | | |
|---|---|---|---|
| 4,075,610 | 2/1978 | Crandall et al. | 365/112 |
| 4,701,880 | 10/1987 | Ichihara | 365/106 |
| 4,933,926 | 6/1990 | Tabei et al. | 365/112 |
| 4,956,714 | 9/1990 | Takanashi et al. | 358/213.11 |
| 5,027,216 | 6/1991 | Takanashi et al. | 358/213.11 |
| 5,095,201 | 3/1992 | Takanashi et al. | 358/300 |
| 5,109,287 | 4/1992 | Clark | 358/102 |
| 5,161,007 | 11/1992 | Takanashi et al. | 365/112 |

FOREIGN PATENT DOCUMENTS 1190178 7/1989 Japan .
2222924 9/1990 Japan .

Primary Examiner—Joseph Mancuso
Assistant Examiner—Wendy R. Greening
Attorney, Agent, or Firm—Michael N. Meller

[57] ABSTRACT

A recording medium is formed by laminating a first transparent electrode, a photoconductive layer member, a recording member and a second transparent electrode in order. The recording medium has voltage supply members, having a conductive material, being provided to peripheral portions of the electrodes, equalizing electric potentials of the peripheral portions respectively when a specific voltage is applied across the electrodes, to make currents flow from the peripheral portions to respective portions of the electrodes, thus a potential difference between the electrodes, thus a potential difference between the electrodes being constant. There is also a recording medium having first and second transparent electrodes, a photoconductive layer member and a recording member. This recording medium has such voltage supply members as above, a first lamination member having a first transparent substrate on which the first transparent electrode and the photoconductive layer member laminated in order, a second lamination member having a second transparent substrate on which the second transparent electrode and the recording member laminated in order, and coupling embers for unifying the lamination members together with a gap of specific width in such a manner that the photoconductive layer member and recording member face each other.

9 Claims, 4 Drawing Sheets

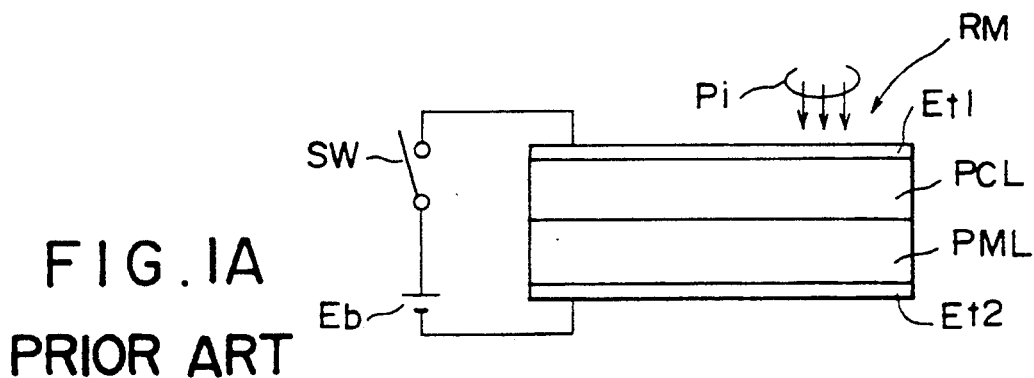
FIG. IA
PRIOR ART
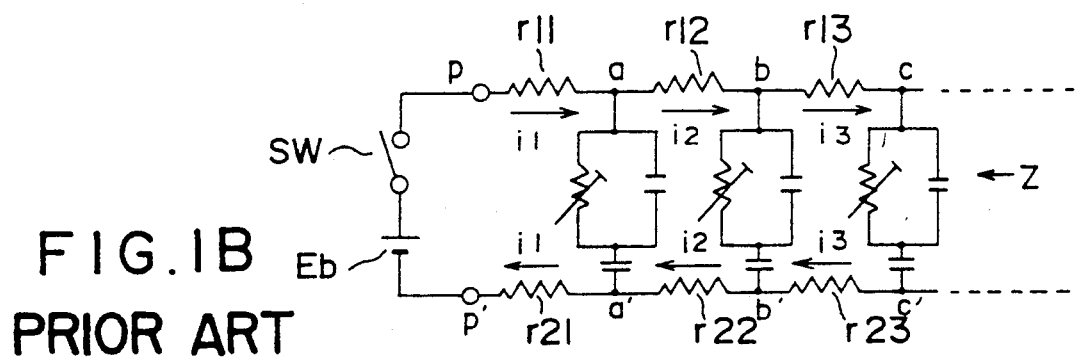
FIG. IB
PRIOR ART
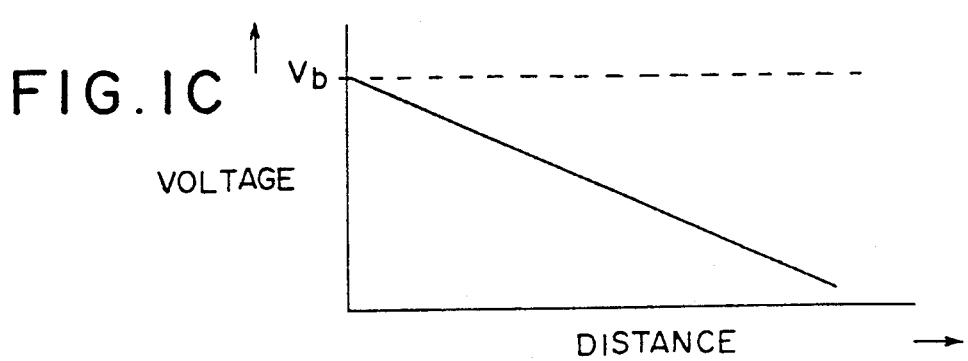
FIG. IC

RECORDING MEDIUM AND RECORDING APPARATUS WHEREIN VOLTAGE IS APPLIED ONLY TO PERIPHERAL EDGES OF THE RECORDING MEDIUM

BACKGROUND OF THE INVENTION

The present invention relates to recording media and recording apparatus thereof.

The use of image signals that have been generated to correspond to an optical image of an object facilitates the performance of edit, trimming and other image processing in the status of electrical signals, and also facilitates the recording and reproduction through the use of a recording material for which the recorded signals can be erased. Conventionally proposed image processing systems in the field of printing and electronic publishing and the like, are as follows: (1) a method where color image signals that have been generated by a color TV camera of the three-tube or single-tube type are recorded to a recording medium such as a VTR, a semiconductor memory, or a magnetic disk or the like, and these are reproduced to obtain color image signals, (2) a method where color image signals that have been generated by a color TV camera of the three-plate or single-plate type are recorded to a recording medium such as a VTR, a semiconductor memory, or a magnetic disk or the like, and these are reproduced to obtain color image signals, and (3) a method where image signals are obtained using a laser telecinema from a color image recorded in a color film by photographing an object by a camera.

In order for the images obtained by image processing systems to be used in the fields of printing and the like, it is required for those images to have a resolution of about 4000 × 4000 pixels. Since there is the problem that a higher resolution cannot be obtained with respect to the camera tube or the the solid state image plate, and the recording system, there is a limit to the degree of resolution of about 1000 × 2000 pixels obtained by HDTV. More specifically, in the color TV cameras that have been conventionally used to generate image signals, an optical image of an object via a camera lens, is passed through a color splitting system and formed on a photo-electric conversion portion of an image pickup device. Then, in the photo-electric conversion portion, the optical image is converted into electrical image, and that image information is outputted as linear image signals on a time axis. The image pickup devices used in color TV cameras such as this are conventionally various known types of image pickup tubes and solid state image pickup devices.

When the image pickup device for the generation of a image signals for a high-quality and high resolution reproduced image, is an image pickup tube, there is a limit to the degree of fineness of the electron beam diameter in the image pickup tube and so the target capacity of the image pickup tube must be increased so as to correspond to the target area and thus it is not possible to obtain a high resolution. In addition, for example, in case of a color image pickup apparatus for moving picture, there is a problem of the signal-to-noise ratio because the frequency bandwidth of the image signals accompanying high resolution becomes greater than several tens of MHz to several hundreds of MHz. For these reasons, when an image pickup tube is used in a color image pickup apparatus, there are difficulties in generating such image signals that it is possible to reproduce high-quality and high-resolution reproduced images.

In this matter, in a conventional color TC camera, there is a limit to the use of HDTV system for which the image pickup device used as a degree of resolution of 1000 × 2000 pixels. Because of this, it is not possible to generate image signals that can reproduce images having a degree of resolution of 4000 × 4000 pixels.

In order to eliminate the problem associated with the conventional technology, the applicant of the present invention has proposed a recording and reproduction method using a charge image that can be recorded and reproduced for an image at a high resolution, as disclosed in U.S. Pat. No. 4,831,452, for example. FIG. 1A is a view for describing the principle of the recording method using charge images, described above. In this figure, a recording medium RM is provided with transparent electrodes Et1, Et2, a photoconductive layer member PCL and a photomodulation layer member PML as a recording member. Connected to the recording medium RM are power source Eb and a switch SW.

Instead of the photomodulation layer member PML, a recording member such as a charge holding layer member, a charge image being held therein by a dielectric material can be used, as disclosed in Japanese Patent Laid-Open No. 1990-222924.

In FIG. 1A, after an optical information Pi (an electro-magnetic radiation beam) which is the object of recording focussed by an image pickup lens (not shown), has passed the transparent electrode Et1 and forms an image on the photoconductive layer material PCL, the electrical resistance value of the photoconductive layer material PCL changes in accordance with the optical information. At this time, the switch SW is in the ON status and a voltage Vb that is generated by the power source Eb is impressed across the transparent electrodes Et1 and Et2.

Accordingly, a charge image corresponding to the optical information Pi is formed at the boundary between the photoconductive layer member PCL and the photomodulation layer member PML. This charge image causes an electrical field having a field intensity corresponding to the optical information Pi, to be impressed to the photomodulation layer member PML. As a result, the optical nature of the photomodulation layer member PML changes in accordance with the field intensity. When an electromagnetic radiation beam for reproduction is irradiated to this photomodulation layer member PML via the transparent electrode Et2, the electromagnetic radiation beam for reproduction changes in accordance with the optical nature and is outputted as a reproduced image.

The photomodulation layer material PML described above is conventionally comprised of lead lanthanum titanate, thermoplastic, or a polymer dispersed-liquid crystal film comprising a polymer material having many fine pores that enclose nematic liquid crystal or smectic liquid crystal. When a polymer dispersed crystal film is used as the photomodulation layer member PML, the status of orientation of the crystals in the many fine pores changes so as to correspond to the optical information Pi. As a result, the transmittance of light of the polymer dispersed-liquid crystal film changes in accordance with the optical information Pi.

In the recording medium RM described above, there is shading in a reproduced image obtained by irradiation of an electromagnetic radiation beam for reproduction to the recording medium RM from the transparent electrode Et2 side occurs when the field intensity formed across the transparent electrodes Et1, Et2 by the voltage Vb impressed thereacross from the power source Eb, changes according to portions of the transparent electrodes. An equivalent circuit of the recording medium RM is shown in FIG. 1B. In the circuit shown in FIG. 1B, r11, r12, ... are electrical resistors of the transparent electrode Et1, and r21, r22, r23, ... are electrical resistors of the transparent electrode Et2. The portion shown by an arrow Z in the figure corresponds to the photoconductive layer member PCL and the photomodulation layer member PML.

In the circuit, when the switch SW is ON, a potential difference between portions a and a' of the transparent electrodes Et1 and Et2 is $Va-a' = Vb - (r11 + r21) * i1$ (i1 is a current flowing through the electrical resistors r11 and r21).

Next, a potential difference between portions b and b' of the transparent electrodes Et1 and Et2 is $Vb-b' = Va-a' - (r12 + r22) * i2$ (i2 is a current flowing through the electrical resistors r12 and r22).

Accordingly, $Vb > Va-a' > Vb-b'$, so that the more the portions of the transparent electrodes Et1 and Et2 are apart from connection points P and P' of the power source Eb and the electrodes, the more the potential difference between the electrodes on those portions is decreased as shown in FIG. 1C. The axis of abscissas of FIG. 1C depicts the distance between the connection points P and P' and the portions of the transparent electrodes Et1 and Et2. Shading thus occurs in the output reproduced image as described above.

SUMMARY OF THE INVENTION

An object of the present invention is to provide a recording medium and a recording apparatus thereof without shading in an output reproduced image.

There is provided a recording medium formed by laminating a first transparent electrode, a photoconductive layer member, a recording member and a second transparent electrode in order, which comprises voltage supply members, having a conductive material, being provided to peripheral portions of the first and second transparent electrodes, equalizing electric potentials of the peripheral portions respectively when a specific voltage is applied across the first and second transparent electrodes, to make currents flow from the peripheral portions to respective portions of the first and second transparent electrodes, thus a potential difference between the first and second transparent electrodes being constant.

There is also provided a recording medium having first and second transparent electrodes, a photoconductive layer member and a recording member, which comprises voltage supply members, having a conductive material, being provided to peripheral portions of the first and second transparent electrodes, equalizing electric potentials of the peripheral portions respectively when a specific voltage is applied across the first and second transparent electrodes, to make currents flow from the peripheral portions to respective portions of the first and second transparent electrodes, thus a potential difference between the first and second transparent electrodes being constant, a first lamination member having a first substrate on which the first transparent electrode and the photoconductive layer member laminated in order, a second lamination member having a second substrate on which the second transparent electrode and the recording member laminated in order, and coupling members for unifying the first and second lamination members together with a gap of specific width in such a manner that the photoconductive layer member and recording member face each other.

There is provided a recording apparatus for recording an image information to a recording medium formed by laminating a first transparent electrode, a photoconductive layer member, a recording member and a second transparent electrode in order, which comprises a power source for applying a specific voltage across the first and second transparent electrodes, voltage supply members, having a conductive material, being provided to peripheral portions of the first and second transparent electrodes, equalizing electric potentials of the peripheral portions respectively when the voltage is applied across the first and second transparent electrodes, to make currents flow from the peripheral portions to respective portions of the first and second transparent electrodes, thus a potential difference between the first and second transparent electrodes being constant, and an image pickup lens for converging light from an object to be recorded onto the photoconductive layer member via the first transparent electrode when the voltage is applied across the first and second transparent electrodes, thus forming an optical image of the object of the photoconductive layer member, wherein an impedance of the photoconductive layer member changes according to an optical intensity of the optical image to form a charge image corresponding to the optical image at a boundary between the photoconductive layer member and the recording member, thus generating an electrical field corresponding to the charge image, the electrical field being applied to the recording member to record an image corresponding to the object to the recording member.

There is also provided a recording apparatus for recording an image information to a recording medium having first and second transparent electrodes, a photoconductive layer member and a recording member, which comprises a power source for applying a specific voltage across the first and second transparent electrodes, voltage supply members, having a conductive material, being provided to peripheral portions of the first and second transparent electrodes, equalizing electric potentials of the peripheral portions respectively when the voltage is applied across the first and second transparent electrodes, to make currents flow from the peripheral portions to respective portions of the first and second transparent electrodes, thus a potential difference between the first and second transparent electrodes being constant, a first lamination member having a first substrate on which the first transparent electrode and the photoconductive layer member laminated in order, a second lamination member having a second substrate on which the second transparent electrode and the recording member laminated in order, coupling members for unifying the first and second lamination members together with a gap of specific width in such a manner that the photoconductive layer member and recording member face each other, and an image pickup lens for converging light from an object to be recorded onto the photoconductive layer member via the first transparent electrode when the voltage is applied across the first and second transparent electrodes, thus forming an optical image of the object on the photoconductive layer member, wherein an impedance of the photoconductive layer member changes according to an optical intensity of the optical image to generate an aerial discharge exhibiting intensity distribution corresponding to the optical intensity, a charge image corresponding to the optical image is formed, by the discharge, on the recording member which faces the photoconductive layer member, to generate an electrical field being applied to the recording member to record an image corresponding to the object to the recording member.

Other object and advantages of the present invention will become apparent from the detailed description to follow taken in conjunction with the appended claims.

BRIEF DESCRIPTION OF THE DRAWINGS

FIG. 1A, 1B and 1C are views for describing the problems with the conventional technology;

DETAILED DESCRIPTION OF THE EMBODIMENTS

Recording media RMa and RMb of the present invention and respectively shown in FIGS. 2A and 2B and FIGS. 4A and 4B, are provided with transparent substrate BP1 and BP2, transparent electrodes Et1, Et2, a photoconductive layer member PCL, a recording member RL, and voltage supply members Em1 and Em2 formed of a good conductor.

Figure 2A:
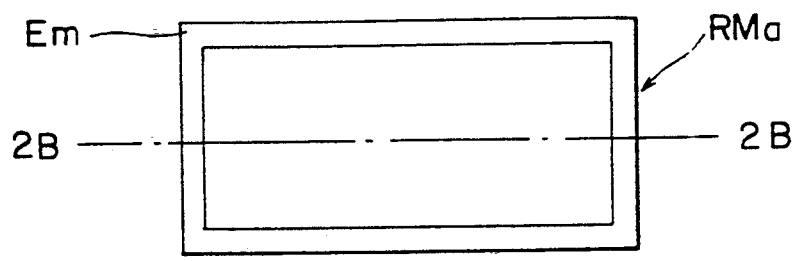
FIGS. 2A and 2B are respectively a plan view and a longitudinal sectional view showing one embodiment of the recording medium of the present inventions.
Figure 2B:
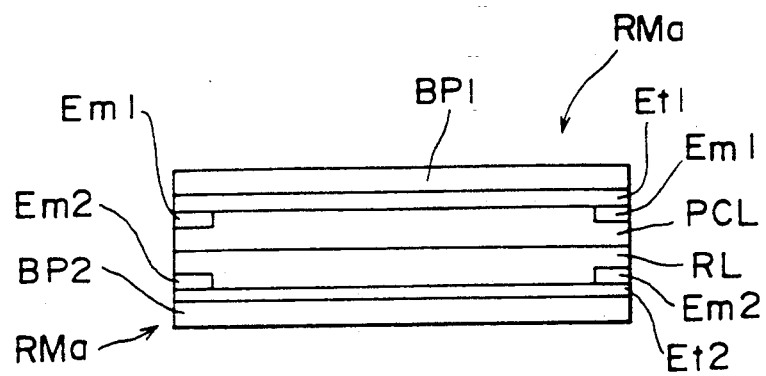
Figure 4A:
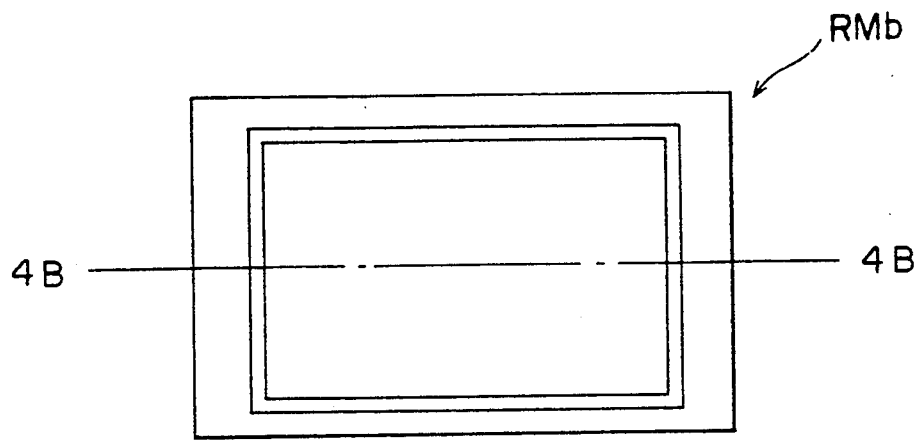
FIGS. 4A and 4B are respectively a plan view and a longitudinal sectional view showing another embodiment of the recording medium of the present inventions.
Figure 4B:
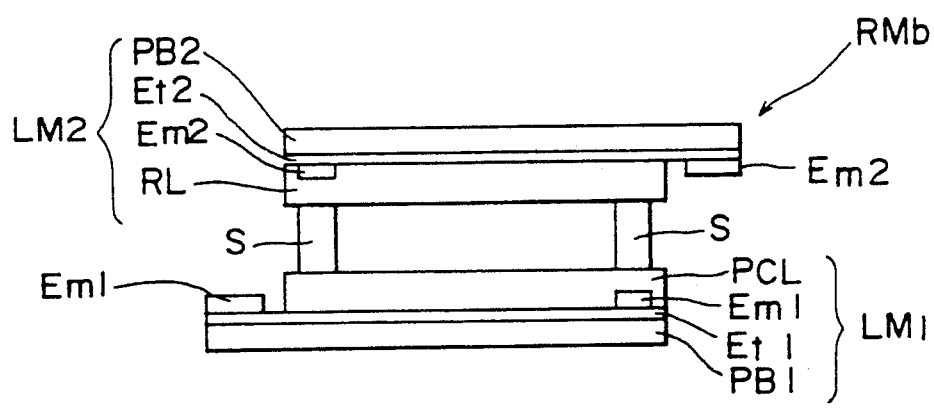

In FIG. 2B, the recording medium RMa is laminated with the transparent electrode Et1, the voltage supply member Em1, the photoconductive layer member PCL, the recording member RL, and the voltage supply member Em2 between the transparent substrates BP1 and BP2. In addition, as shown in FIG. 4B, a first lamination member LM1 is formed by laminating the transparent electrode Et1, the voltage supply member Em2, and the photoconductive layer member PCL to the transparent substrate BP1 and a second lamination layer member LM2 is formed by laminating the transparent electrode Et2, the voltage supply member Em2, and the recording member RL to the transparent substrate BP2. Then, spacers S, S are inserted between the first and second lamination members LM1 and LM2 so as to have a required gap being formed between the photoconductive layer member PCL and the recording member RL, to therefore form the recording medium RMb.

The shape of the recording media RMa and RMb can be either disc, tape, card, or film.

In the recording media RMa and RMb of the present invention, the voltage supply member Em1 provided to the peripheral portion of the transparent electrode Et1, and the voltage supply member Em2 provided to the peripheral portion of the transparent electrode Et2 can be formed using a metal or a conductive resin for example, so that they have a low resistance. These voltage supply members Em1 and Em2 are means of equalizing the potential on the peripheral portion of the transparent electrodes Et1 and Et2.

Figure 3:
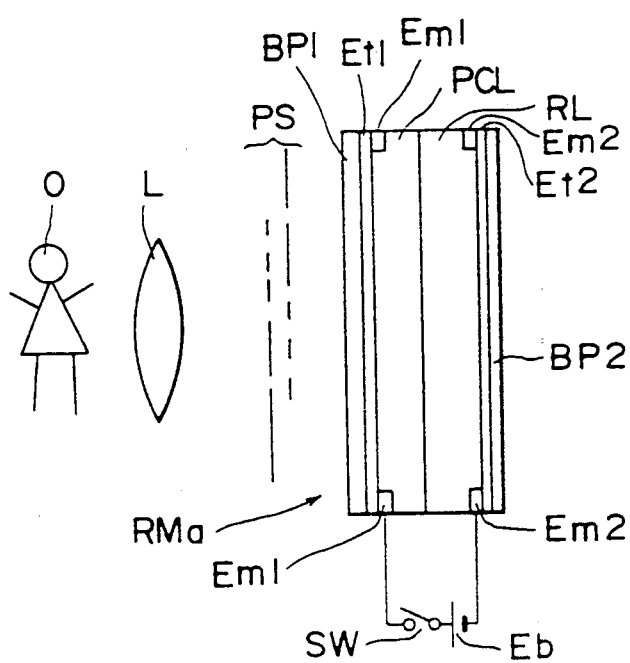
FIG. 3 is an elevational view of a recording apparatus that performs recording using the recording medium shown in FIGS. 2A and 2B.
Figure 5:
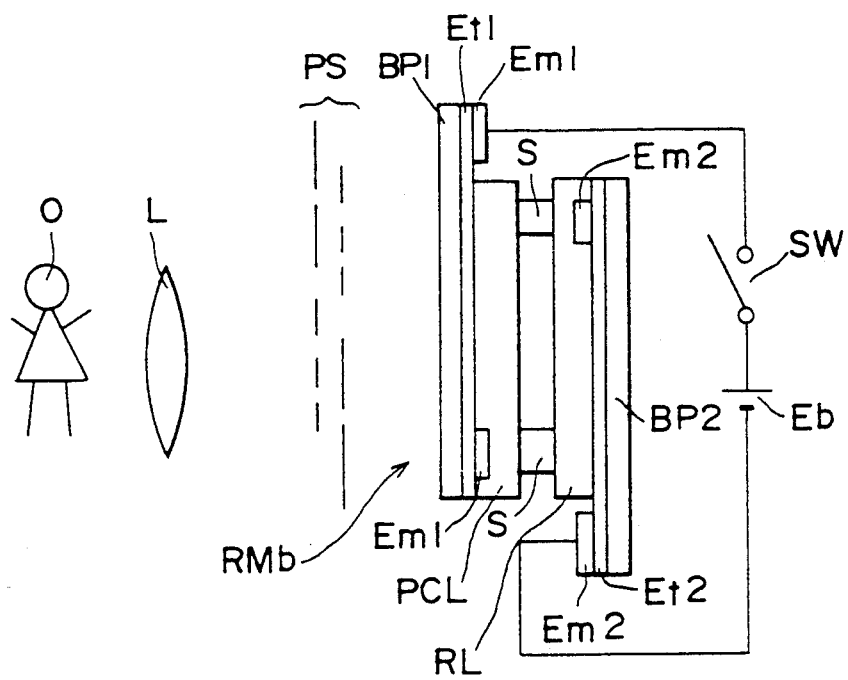
FIG. 5 is an elevational view of a recording apparatus that performs recording using the recording medium shown in FIGS. 4A and 4B.

At the time of recording operation, the switches SW shown in FIGS. 3 and 5 turns on and the power supply Eb supplies a voltage to the voltage supply members Em1 and Em2, the same voltage is respectively applied from the voltage supply member Em1 and Em2 to the peripheral portions of the transparent electrodes Et1 and Et2.

Currents thus flow from the peripheral portions to such portions of the transparent electrodes Et1 and Et2 as a and a' and b and b' as shown in FIG. 1B so that voltage drops as described before with respect to FIG. 1C, due to electrical resistors of the transparent electrodes Et1 and Et2 does not occur. Accordingly, a field intensity generated across the transparent electrodes Et1 and Et2 do not change with respect to the portions of the transparent electrodes Et1 and Et2 and so there is no generation of shading in the reproduced image obtained by the irradiation of an electromagnetic radiation beam for reproduction to the recording member RL via the transparent electrode Et2. When the present invention is implemented, the voltage supply material can be provided to only one of the transparent electrodes Et1 and Et2.

The recording member RL which is used in the recording media RMa and RMb can be a photomodulation layer member that uses a polymer dispersed liquid crystal film described above. In addition, a charge holding layer member formed using a dielectric material for holding a charge image can be used as the recording member RL.

In FIGS. 3 and 5, recording apparatus are respectively provided with the recording media RMa and RMb described above, and a switch SW, a power source Eb, an image pickup lens L, and an optical shutter PS.

First, in the recording apparatus shown in FIG. 3, during the period that the optical shutter PS is open, light from an object O is focussed by the image pickup lens L and passes through the transparent electrode Et1 and then an optical image of the object O is formed on the photoconductive layer member PCL. The value of the electrical resistance of the photoconductive layer member PCL thus changes in accordance with the optical intensity of the optical image of the object O. During that period the switch SW has turned ON, and so when a voltage Vb that is generated from the power source Eb is applied to the voltage supply members Em1 and Em2 provided to the periphery of the transparent electrodes Et1 and Et2 via the switch SW, the same potential is applied to the entire surface of the transparent electrode Et1 from the voltage supply member Em1 provided to the periphery of a recording region of the transparent electrode Et1. In addition, the same potential is applied to the entire surface of the transparent electrode Et2 from the voltage supply member Em2 provided to the periphery of a recording region of the transparent electrode Et2. Accordingly, an equal electrical field is formed across the transparent electrodes Et1 and Et2.

A charge image corresponding to the optical image of the object O is therefore formed at the boundary between the recording member RL and the photoconductive layer member PCL for which the value of the electrical resistance changes in accordance with the optical image of the object O. When the recording member RL described above is a photomodulation layer member, an electrical field corresponding to the optical intensity of the optical image of the object O is impressed to the photomodulation layer member due to that charge image. As a result, the optical nature of the photomodulation layer member changes in accordance with the electrical field and thus an optical image of the object O is recorded to the photomodulation layer member. When a charge holding layer member formed using a dielectric material is used for the recording material RL, an electrical charge corresponding to the optical image of the object O is recorded to the charge holding layer.

In the same manner as shown in FIG. 3, in the recording apparatus shown in FIG. 5, the value of the electrical resistance of the photoconductive layer member PCL changes in accordance with the optical intensity of the optical image of the object O, so that an electrical filed where there is no potential difference changing between the transparent electrodes Et1 and Et2.

Accordingly, an electrical field that has an intensity distribution corresponding to the optical intensity of the optical image of the object O is formed in the gap between the recording member RL and the photoconductive layer member PCL. This field causes an aerial discharge to the gap and a charge image corresponding to the optical intensity of the optical image of the object O is formed on the recording member RL.

As has already been described, the charge image recorded by the recording apparatus shown in FIGS. 3 and 5 brings about a reproduced image that has no shading.

What is claimed is:

1. A recording medium comprising:
a first transparent electrode, a photoconductive layer member, laminated on said first transparent electrode;
a recording member, a second electrode laminated on said recording member in the order named,
means for separating said photoconductive layer from said recording member so as to form a gap therebetween of a predetermined width; and
an electrical conductive member formed of a conductive material, being laminated on one of said first and said second electrodes so that said conductive member is arranged to supply an electrical potential to a peripheral region to provide a uniform potential difference between said first and said second electrodes,
said uniform potential difference serving generation of a stable electrical field corresponding to an image applied from said photoconductive layer member to said recording member to record said image without shading.

2. A recording medium having a first transparent electrode and a second transparent electrode, a photoconductive layer member and a recording member, comprising:
electrical conductive members, each formed of a conductive material, being laminated on the annular periphery of said first and said second electrodes, respectively so that said conductive members are arranged to supply electric potential to a peripheral region to provide a uniform potential difference between said first and said second electrode;
a first lamination member having a first substrate on which said first electrode and said photoconductive layer member are laminated, in the order named;
a second lamination member having a second substrate on which said second electrode and said recording member are laminated, in the order named; and
coupling members for unifying said first and second lamination members together with a gap of a specific width so that said photoconductive layer member and recording member are separated and face each other.

3. A recording medium for recording an image information to a recording medium formed by laminating a first transparent electrode, a photoconductive layer member, a recording member and a second transparent electrode, in the order named, comprising:
means for separating said photoconductive layer member from said recording member so as to form a gap therebetween of a predetermined width; and
a power source for applying a specific voltage across said first and second transparent electrodes;
an electrical conductive member formed of a conductive material, being laminated on the annular periphery of one of said first and said second electrodes, respectively so that said conductive member is arranged to supply electric potential to a peripheral region to provide a uniform potential difference between said first and said second electrode; and
an image pickup lens for directing light from an object to be recorded onto said photoconductive layer member via said first transparent electrode when said specific voltage is applied across said first and second transparent electrodes, thus forming an optical image of said object on said photoconductive layer member,
wherein an impedance of said photoconductive layer member changes according to an optical intensity of said optical image to form a charge image corresponding to said optical image at a boundary between said photoconductive layer member and said recording member, so that an electrical field corresponding to said charge image is generated which is applied to said recording member, thus an image of said object is recorded to said recording member.

4. An apparatus according to claim 3, wherein said recording member includes a photomodulation member, thus an optical image of said object is recorded onto said photomodulation layer.

5. An apparatus according to claim 3, wherein said recording member includes a charge holding member having a dielectric material, thus an electrical charge corresponding to said image of said object is recorded onto said charge holding member.

6. A recording apparatus for recording an image information to a recording medium formed by laminating a first transparent electrode, a photoconductive layer member, a recording member and a second transparent electrode, in order comprising:
a power source for applying a specific voltage across said first and second transparent electrodes;
an electrical conductive member formed of a conductive material, being laminated on the annular periphery of one of said first and said second electrodes, respectively so that said conductive member is arranged to supply electric potential to a peripheral region to provide a uniform potential difference between said first and said second electrode;

a first lamination member having a first substrate on which said first transparent electrode and said photoconductive layer member laminated in the order named;

a second lamination member having a second substrate on which said second transparent electrode and said recording member laminated in the order named;

coupling members for unifying said first and second lamination members together with a gap of specific width so that said photoconductive layer member and said recording member face each other; and an image pickup lens for directing light from an object to be recorded onto said photoconductive layer member via said first transparent electrode when said specific voltage is applied across said first and second transparent electrodes, thus forming an optical image of said object on said photoconductive layer member, wherein an impedance of said photoconductive layer member changes according to an optical intensity of said optical image to form a charge image corresponding to said optical image at a boundary between said photoconductive layer member and said recording member, so that an electrical field corresponding to said charge image is generated which is applied to said recording member, thus an image of said object is recorded onto said recording member.

7. An apparatus according to claim 6, wherein recording member includes a photomodulation member, thus an optical image of said object is recorded onto said photomodulation layer.

8. An apparatus according to claim 6, wherein said recording member includes a charge holding member having a dielectric material, thus an electrical charge corresponding to said image of said object is recorded onto said charge holding member.

9. A recording medium comprising:

a first transparent electrode, a photoconductive layer member, laminated on said first transparent electrode;

a recording member, a second electrode laminated on said recording member, in the order named, means for separating said photoconductive layer from said recording member so as to form a gap therebetween of a predetermined width; and an electrical conductive member formed of a conductive material, being laminated on the annular periphery of one of said first and said second electrodes so that said conductive members are arranged with an annular shape to supply an electrical potential to a peripheral region to provide a uniform potential difference between said first and said second electrodes, said uniform potential difference serving generation of a stable electrical field corresponding to an image applied from said photoconductive layer member to said recording member to record said image without shading.

* * * * *